(12) United States Patent
Mu et al.

(10) Patent No.: US 9,106,501 B2
(45) Date of Patent: Aug. 11, 2015

(54) QUADRATURE POWER AMPLIFIER HAVING INCREASED EFFICIENCY

(71) Applicant: Telefonaktiebolaget L M Ericsson (Publ), Stockholm (SE)

(72) Inventors: Fenghao Mu, Hjärup (SE); Sven Mattisson, Bjärred (SE); Thomas Olsson, Karlshamn (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 137 days.

(21) Appl. No.: 13/856,206

(22) Filed: Apr. 3, 2013

(65) Prior Publication Data

US 2014/0300426 A1 Oct. 9, 2014

(51) Int. Cl.
*H04L 27/20* (2006.01)
*H04L 27/36* (2006.01)
(Continued)

(52) U.S. Cl.
CPC ............ *H04L 27/362* (2013.01); *H03F 1/0222* (2013.01); *H03F 1/0227* (2013.01); *H03F 3/24* (2013.01); *H04B 1/0475* (2013.01); *H04L 27/368* (2013.01); *H03C 1/00* (2013.01); *H03C 1/06* (2013.01); *H03C 3/40* (2013.01); *H03F 2200/336* (2013.01); *H03F 2200/451* (2013.01); *H04B 2001/0416* (2013.01); *H04L 27/361* (2013.01)

(58) Field of Classification Search
CPC .............. H03C 1/00; H03C 1/06; H03C 3/40; H03F 2200/336; H03F 1/0222; H03F 1/0227; H03F 3/24; H03F 2200/451; H04L 27/362; H04L 27/361; H04L 27/368; H04B 1/0475; H04B 2001/0416

USPC ........... 332/103, 115, 120, 15, 145, 149, 151, 332/155; 330/10, 124 R; 375/296, 297, 298; 455/114.3
See application file for complete search history.

(56) References Cited

U.S. PATENT DOCUMENTS 7,139,534 B2   11/2006   Tanabe et al.
7,830,220 B2 *  11/2010   Ceylan et al. ................. 332/145
(Continued)

FOREIGN PATENT DOCUMENTS

WO   2011161759 A1   12/2011

OTHER PUBLICATIONS

Invitation to Pay Additional Fees, Form PCT/ISA/206, dated Aug. 4, 2014 for International Application Serial No. PCT/EP2014/056262, International filing date: Mar. 28, 2014 consisting of 6-pages.
(Continued)

*Primary Examiner* — Arnold Kinkead
*Assistant Examiner* — Richard Tan
(74) *Attorney, Agent, or Firm* — Christopher & Weisberg, P.A.

(57) ABSTRACT

A method and system for achieving increased efficiency in a quadrature modulated power amplifier (11) are disclosed. In some embodiments, a supply path (36, 40) and a gain path (38, 42) are provided in each of an I-channel and a Q-channel. The supply path (36, 40) produces a variable voltage and the gain path (38, 42) produces a gain control signal. The variable voltage and gain control signal are used by a variable gain power amplifier (44, 46) to modulate a local oscillator signal to produce a modulated radio signal.

22 Claims, 14 Drawing Sheets

(51) Int. Cl.
*H03F 1/02* (2006.01)
*H03F 3/24* (2006.01)
*H04B 1/04* (2006.01)
*H03C 3/40* (2006.01)
*H03C 1/00* (2006.01)
*H03C 1/06* (2006.01)

(56) References Cited

U.S. PATENT DOCUMENTS

| | | | |
|---|---|---|---|
| 2005/0030104 A1* | 2/2005 | Chen et al. | 330/295 |
| 2005/0064830 A1 | 3/2005 | Grigore | |
| 2006/0226903 A1 | 10/2006 | Muller et al. | |
| 2006/0229036 A1 | 10/2006 | Muller et al. | |
| 2009/0267581 A1 | 10/2009 | Nentwig | |
| 2010/0208848 A1 | 8/2010 | Zhu et al. | |
| 2010/0219888 A1 | 9/2010 | Lesso | |
| 2011/0156814 A1 | 6/2011 | Krvavac et al. | |
| 2013/0100999 A1 | 4/2013 | Furuta et al. | |

OTHER PUBLICATIONS

Jason T. Stauth and Seth R. Sanders, "Optimum Bias Calculation for Parallel Hybrid Switching-Linear Regulators", 1-4244-0714-1/071 C 2007 IEEE. pp. 569-574 consisting of 6-pages.

Bumman Kim et al., "Efficiently Amplified" Focused Issue Feature, 2010 IEEE. Reprinted from the IEEE Microwave Magazine, Aug. 2010. pp. 87-100 consisting of 14-pages.

Jinsung Choi et al., "A New Power Management IC Architecture for Envelope Tracking Power Amplifier", IEEE Transactions on Microwave Theory and Techniques, vol. 59, No. 7, Jul. 2011 pp. 1796-1802 consisting of 7-pages.

International Search Report and Written Opinion, from PCT/ISA/220, dated Sep. 17, 2014 for International Application Serial No. PCT/EP2014/056262, International filing date: Mar. 28, 2014 consisting of 20-pages.

Li et al.: "Quadrature Power Amplifier for RF Applications", pp. 1-99, XP055127470, Retrieved from the Internet: URL:http://essay.utwente.nl/59423/1/scriptie_C_Li.pdf [retrieved on Jul. 8, 2014] dated Nov. 1, 2009 consisting of 99-pages.

* cited by examiner

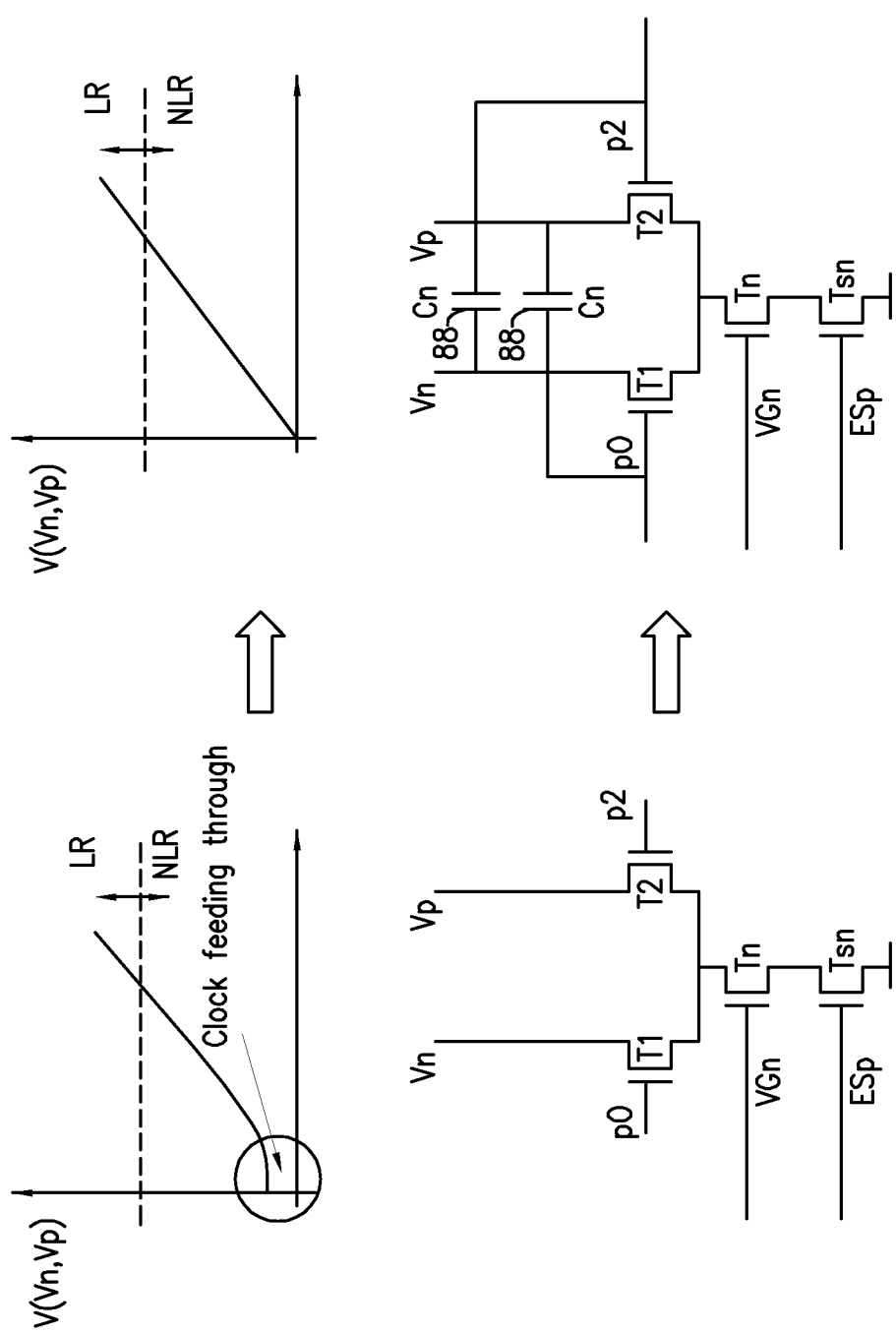

QUADRATURE POWER AMPLIFIER HAVING INCREASED EFFICIENCY

TECHNICAL FIELD

The present invention relates to power amplification, and more particularly to methods and systems for improving power efficiency in a power amplifier such as in a digital modulated RF power amplifier.

BACKGROUND

RF power amplifiers are used in wireless communications such as in base stations and mobile phones in a cellular radio network, or as a further example, in wireless access points and wireless computing devices in a WiFi network. Conventional analog RF transmitter architectures are difficult to design to achieve good linearity and power efficiency simultaneously. Good linearity results in high power consumption, because the amplifier in the power amplifier architecture operates as a Class A or Class AB amplifier, resulting in poor power efficiency in a power back-off mode. Analog power amplifiers have other disadvantages including a requirement of a large surface area, difficulty of integration on a chip, and a requirement of matching networks between an RF integrated circuit (RFIC) and the power amplifier (PA).

Digital modulated RF power amplifiers have the potential to achieve better power efficiency and linearity than analog power amplifiers, since pre-distortion can be performed more accurately and with lower energy consumption. This is helpful in mobile devices such as mobile phones that are powered by batteries with limited life. Digital modulated RF power amplifiers may generally be classified into two categories: quadrature modulated PAs and polar modulated PAs. Quadrature modulated PAs have two balanced amplitude modulation (AM) paths and polar modulated PAs have one AM path and one phase modulation (PM) path.

A polar modulated PA may operate at higher efficiency than a quadrature modulated PA. However, countering band expansion in a polar modulated PA is difficult, especially for wideband applications such as the Long Term Evolution (LTE) systems, where baseband signal bandwidth is as wide as 20 Megahertz (MHz), and the shortest duplex distance for a frequency division duplex band is 80 MHz. Due to signal bandwidth expansion in a polar modulated PA, adjacent channel interference and error vector magnitude (EVM) is high. Another disadvantage of polar modulated PAs is mismatch between the AM path and the PM path. These two paths are physically and electrically quite different, yet the maximum allowable delay mismatch between them should be less than a nanosecond, which is very difficult to achieve.

A quadrature modulated PA, also called an IQ modulated PA, has lower power efficiency than a polar modulated PA, has less bandwidth expansion, and has symmetric channels. Thus, the quadrature modulated PA is easier to implement and is more suitable for wideband applications such as LTE, but is not as efficient as other technologies.

Various references are directed to design of features of power amplifiers and power supplies. In "Optimum Bias Calculation for Parallel Hybrid Switching Linear Regulators", Stauth, et. al, IEEE Transactions on Power Electronics, vol. 22, no. 5, September 2007, pages 1978-1985, bias constraints for switching and linear voltage regulators are analyzed and ideal expressions for the optimum current contribution of the switching regulator are derived. The article entitled "Efficiently Amplified," Kim, et. al, IEEE Microwave Magazine, vol. 11, no. 5, August 2010, pages 87-100, generally discusses supply modulated power amplifiers. U.S. Patent Application Publication No. 2010/0208848 describes a quadrature modulator for producing I and Q channel signals. "A New Power Management IC Architecture for Envelope Tracking Power Amplifier," Choi, et. al., IEEE Transactions on Microwave Theory and Techniques, vol. 59, no. 7, July 2011, pages 1796-1802, describes a power supply modulator for use with a power amplifier. U.S. Patent Application Publication No. 2005/0064830 describes a DC to DC converter having a switch mode part and a linear mode part. U.S. Pat. No. 7,139,534 describes a modulated signal generator having a phase component line and an amplitude component line. U.S. Patent Application Publication No. 2009/0267581 describes a switched mode power supply and a linear mode power supply.

Two common sources of reduced power efficiency in both polar modulated and quadrature modulated PAs are (1) power back off mode and (2) large peak to average power ratio (PAPR) in multicarrier based modulation methods such as orthogonal frequency division multiplexing (OFDM) used in LTE. As a consequence of these two factors, a PA operates at a very low average power level yet has a high PAPR, leading to very low power efficiency.

SUMMARY

The present invention advantageously provides a method and system for improving power efficiency of a digital quadrature amplitude modulated RF power amplifier. According to one aspect, the invention provides a power amplifier subsystem that includes a first channel circuit. The first channel circuit has a first channel supply path, a first channel gain path and a first channel variable gain amplifier. The first channel supply path is configured to process a first channel input signal to produce a first channel variable voltage based on the first channel input signal. The first channel gain path is configured to process the first channel input signal to produce a first channel gain control signal. The first channel variable gain amplifier is configured to receive the first channel variable voltage, receive the first channel gain control signal, and amplify a local oscillator signal. During operation, the first channel variable voltage is applied as a supply voltage to the first channel variable gain amplifier. A gain of the first channel variable gain amplifier is modulated by the first channel gain control signal to modulate the local oscillator signal and to produce a modulated radio signal.

According to this aspect, in some embodiments, the first channel variable voltage produced by the first channel supply path is a non-constant function of the first channel input signal if the first channel input signal exceeds a threshold and is a constant if the first channel input signal is below the threshold. Also. the first channel gain control signal produced by the first channel gain path is a constant if the first channel input signal exceeds the threshold and is a non-constant function of the first channel input signal if the first channel input signal is below the threshold.

In some embodiments, the first channel supply path includes a lower limit pre-distortion circuit and a DC to DC converter. The lower limit pre-distortion circuit is configured to receive the first channel input signal and to pre-distort the first channel input signal to produce a first pre-distorted output signal. The DC to DC converter is configured to receive the first pre-distorted output signal. The DC to DC converter is also configured to apply a first operation to the first pre-distorted output signal to produce the first channel variable voltage. The first operation produces distortion that substantially negates the pre-distortion produced by the lower limit pre-distortion circuit.

In some embodiments, the first channel gain path includes an upper limit pre-distortion circuit and a variable gain circuit. The upper limit pre-distortion circuit is configured to receive the first channel input signal and to pre-distort the first channel input signal to produce a second pre-distorted output signal. The variable gain circuit is configured to receive the second pre-distorted output signal, and to apply a second operation to the second pre-distorted output to produce the variable gain control signal. The operation produces distortion that substantially negates the pre-distortion produced by the upper limit pre-distortion circuit.

In some embodiments, the power amplifier subsystem further includes a second channel circuit electrically in parallel with the first channel circuit. The second channel circuit includes a second channel supply path, a second channel gain path and a second channel variable gain amplifier. The second channel supply path is configured to process a second channel input signal to produce a second channel variable voltage based on the second channel input signal. The second channel gain path is configured to process the second channel input signal to produce a second channel gain control signal. The second channel variable gain amplifier is configured to receive the second channel variable voltage, receive the second channel gain control signal and amplify the local oscillator signal. During operation, the second channel variable voltage is applied as a supply voltage of the second channel variable gain amplifier. A gain of the second channel variable gain amplifier is modulated by the second channel gain control signal to modulate the local oscillator and to produce a modulated radio signal.

In some embodiments the first operation and the second operation are calculated to produce an output of the first channel variable gain amplifier that is approximately equal to a constant gain multiplied by the first channel input signal multiplied by the local oscillator signal. In some embodiments, the first operation and the second operation are calculated to produce an output of the first channel variable gain amplifier that is approximately a function of the first pre-distorted output signal multiplied by a sign function multiplied by a function of the second pre-distorted output signal if the first channel input signal is less than a threshold, and a function of the first pre-distorted output signal multiplied by a sign function multiplied by a constant if the first channel input signal is greater than the threshold.

In some embodiments, the first operation applied to the first pre-distorted output signal is a non-linear function of the first channel input signal modeled as a polynomial function with coefficients chosen to reduce transient components of the first pre-distorted output signal. In some embodiments, the first channel supply path further includes an auxiliary linear power regulator configured to compensate for group delay so that the first channel supply path exhibits an approximately linear phase as a function of frequency. In some embodiments, the first channel variable gain amplifier is driven by a variable gain carrier clock. A gain of the variable gain carrier clock is adjusted by weighted enable signals.

In some embodiments, the first channel variable gain amplifier has parallel circuit paths and a gain of the first channel variable gain amplifier is adjusted by enabling a selected number of parallel circuit paths of the first channel variable gain amplifier. In some embodiments, a gain of the first channel variable gain amplifier is controlled by controlling a tail current of at least one unit cell of the first channel variable gain amplifier via one of a current mode and a voltage mode. In some embodiments, the first channel variable gain amplifier further includes neutralization capacitors to compensate for carrier clock signal leakage.

According to another aspect, the invention provides a quadrature power amplifier subsystem. The quadrature power amplifier subsystem includes an I-channel DC to DC converter and a Q-channel DC to DC converter. The I-channel DC to DC converter converts an I-channel input signal to an I-channel output signal. The I-channel DC to DC converter is modulated by a first modulation signal to cause a reversal of a polarity of the I-channel input signal at one of negative and positive alternations, so that the I-channel output signal is of a single polarity. The Q-channel DC to DC converter converts a Q-channel input signal to a Q-channel output signal. The Q-channel DC to DC converter is modulated by a second modulation signal to cause a reversal of a polarity of the Q-channel input signal at the one of negative and positive alternations, so that the Q-channel output signal is of the single polarity.

According to this aspect, in some embodiments, the quadrature power amplifier subsystem includes an I-channel power amplifier that receives the I-channel output signal and a Q-channel power amplifier that receives the Q-channel output signal. The I-channel power amplifier has an I-channel positive amplifier part and an I-channel negative amplifier part. The I-channel positive amplifier part receives a first positive enable signal to enable output of the I-channel positive amplifier part during a period of time corresponding to a positive polarity of the I-channel input signal. The I-channel negative amplifier part receives a first negative enable signal to enable output of the I-channel negative amplifier part during a period of time corresponding to a negative polarity of the I-channel input signal. The Q-channel power amplifier has a Q-channel positive amplifier part and a Q-channel negative amplifier part. The Q-channel positive amplifier part receives a second positive enable signal to enable output of the Q-channel positive amplifier part during a period of time corresponding to a positive polarity of the Q-channel input signal. The Q-channel negative amplifier part receives a second negative enable signal to enable output of the Q-channel negative amplifier part during a period of time corresponding to a negative polarity of the Q-channel input signal.

In some embodiments, the I-channel power amplifier modulates a local oscillator signal via the I-channel output signal to produce an I-channel RF signal, and the Q-channel power amplifier modulates a local oscillator signal via the Q-channel output signal to produce a Q-channel RF signal. In some embodiments, the quadrature power amplifier subsystem further includes a first signal combiner and a second signal combiner. The first signal combiner is configured to produce a positive RF signal by combining an output of the I-channel positive amplifier part; a negative of an output of the I-channel negative amplifier part; an output of the Q-channel positive amplifier part; and a negative of an output of the Q-channel negative amplifier part. The second signal combiner is configured to produce a negative RF signal by combining a negative of the output of the I-channel positive amplifier part; the output of the I-channel negative amplifier part; a negative of the output of the Q-channel positive amplifier part; and the output of the Q-channel negative amplifier part.

In some embodiments, the quadrature power amplifier subsystem further includes a third signal combiner configured to combine the positive RF signal and the negative RF signal to produce an RF output signal. In some embodiments, the quadrature power amplifier subsystem further includes a first pre-distortion circuit configured to pre-distort the I-channel input signal prior to input of the I-channel input signal to the I-channel DC to DC converter. In some embodiments, the I-channel output is a non-constant function of the I-channel input signal if the I-channel input signal exceeds a threshold and is a constant if the I-channel input signal is below the threshold. In some embodiments, the Q-channel output is a non-constant function of the Q-channel input signal if the Q-channel input signal exceeds a threshold and is a constant if the Q-channel input signal is below the threshold.

In some embodiments, the quadrature power amplifier subsystem further includes an I-channel gain path producing an I-channel gain control signal. The I-channel gain control signal is a constant if the I-channel input signal exceeds the threshold and is a non-constant function of the I-channel input signal if the I-channel input signal is below the threshold. In some embodiments, a Q-channel gain path producing a Q-channel gain control signal. The Q-channel gain control signal is a constant if the Q-channel input signal exceeds the threshold and is a non-constant function of the Q-channel input signal if the Q-channel input signal is below the threshold.

BRIEF DESCRIPTION OF THE DRAWINGS

A more complete understanding of the present invention, and attendant advantages and features thereof, may be obtained by reference to the following detailed description when considered in conjunction with the accompanying drawings wherein:

FIG. 14 is a graph of an output voltage as a function of input signal and a circuit of a partial unit cell of a power amplifier;

FIG. 15 is a graph of an output voltage as a function of input signal and a circuit of a partial unit cell of a power amplifier;

DETAILED DESCRIPTION

Figure 1:
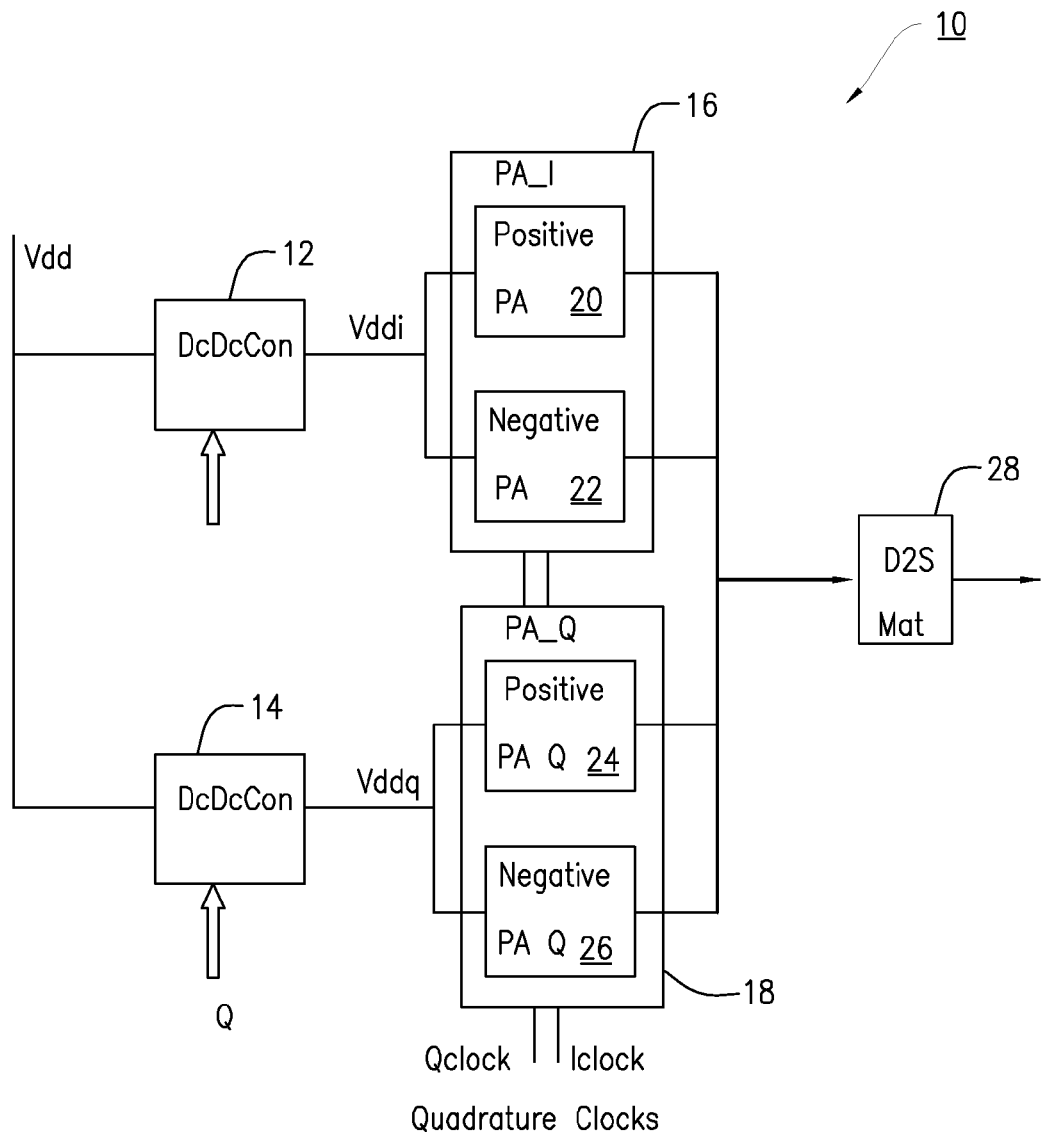
FIG. 1 is a block diagram of a quadrature modulated power amplification subsystem constructed in accordance with principles of the present invention.

Before describing in detail exemplary embodiments that are in accordance with the present invention, it is noted that the embodiments reside primarily in combinations of apparatus components and processing steps related to improving power efficiency of a digital quadrature amplitude modulated RF power amplifier. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Referring to the drawing figures, there is shown in FIG. 1 a block diagram of a quadrature modulated power amplification subsystem 10 with two DC to DC converters 12 and 14 and two power amplifiers 16 and 18. The power amplifier 16 has a positive section 20 and a negative section 22. The power amplifier 18 has a positive section 24 and a negative section 26. The outputs of the power amplifiers 16 and 18 are combined by an output network 28.

The I and Q signals received by DC to DC converters 12 and 14, respectively, can be either negative or positive. However, to simplify ground connections, the DC to DC converters 12 and 14 do not provide negative voltages, in some embodiments. Even if the DC to DC converters could provide negative voltages, then the power amplifiers 16 and 18 would be biased as Class A amplifiers, which is not power efficient. To achieve high efficiency, power amplifiers 16 and 18 may be implemented as switch mode power amplifiers with an inductive load to provide negative modulated RF signal output. Therefore, the power amplifiers 16 and 18 include positive and negative sections.

Signal conversions are used for absolute amplitude modulation resulting in converted I and Q signals. The converted I and Q signals are absolute amplitude modulated by I and Q digital vector signals, respectively. The outputs of the DC to DC converters 12 and 14 are analog voltages given by:

$$Vi = a|i|$$

$$Vq = a|q|$$

where a>0 is a conversion constant and i and q are the input quadrature modulation signals.

Figure 2:
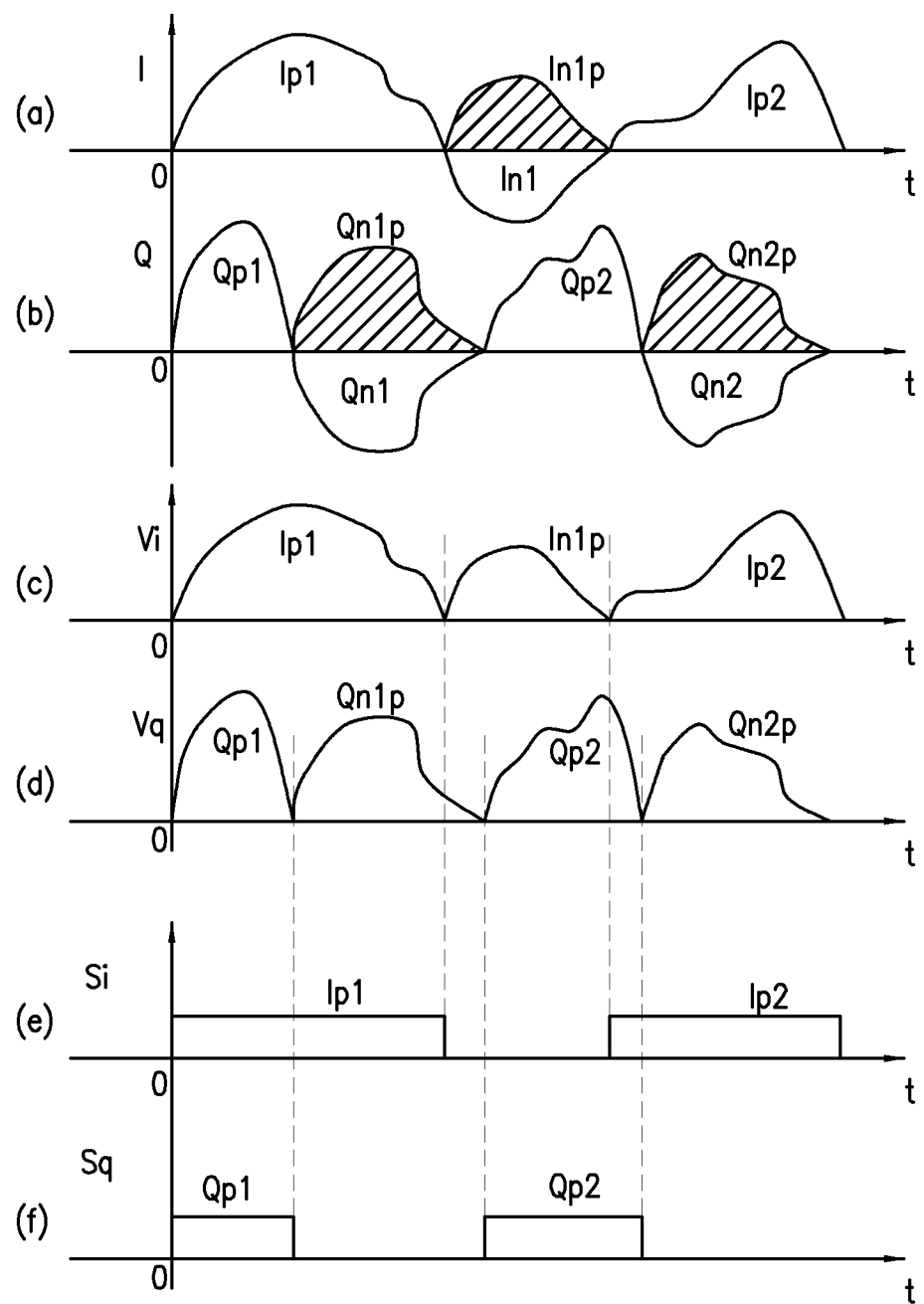
FIG. 2 is a series of graphs of representative signals in a quadrature modulated power amplification subsystem constructed as in FIG. 1.

As shown in FIG. 2, graph (a) is a representative I-channel signal and graph (b) is a representative Q-channel signal. Each of the I-channel signal and the Q-channel signal have both positive and negative excursions. When the I-channel signal and the Q-channel signal are input into DC to DC converters 12 and 14, respectively, the outputs of the DC to DC converters 12 and 14 are as shown in graphs (c) and (d), respectively. The polarity signals for controlling the polarities of the outputs of the DC to DC converters are shown in graphs (e) and (f).

Thus, the I-channel DC to DC converter is modulated by a first modulation signal to cause a reversal of a polarity of the I-channel input signal at one of negative and positive alternations, so that the I-channel output signal of the I-channel DC to DC converter is of a single polarity. Similarly, the Q-channel DC to DC converter is modulated by a second modulation signal to cause a reversal of a polarity of the Q-channel input signal at one of negative and positive alternations, so that the Q-channel output signal of the Q-channel DC to DC converter is of a single polarity.

Figure 3:
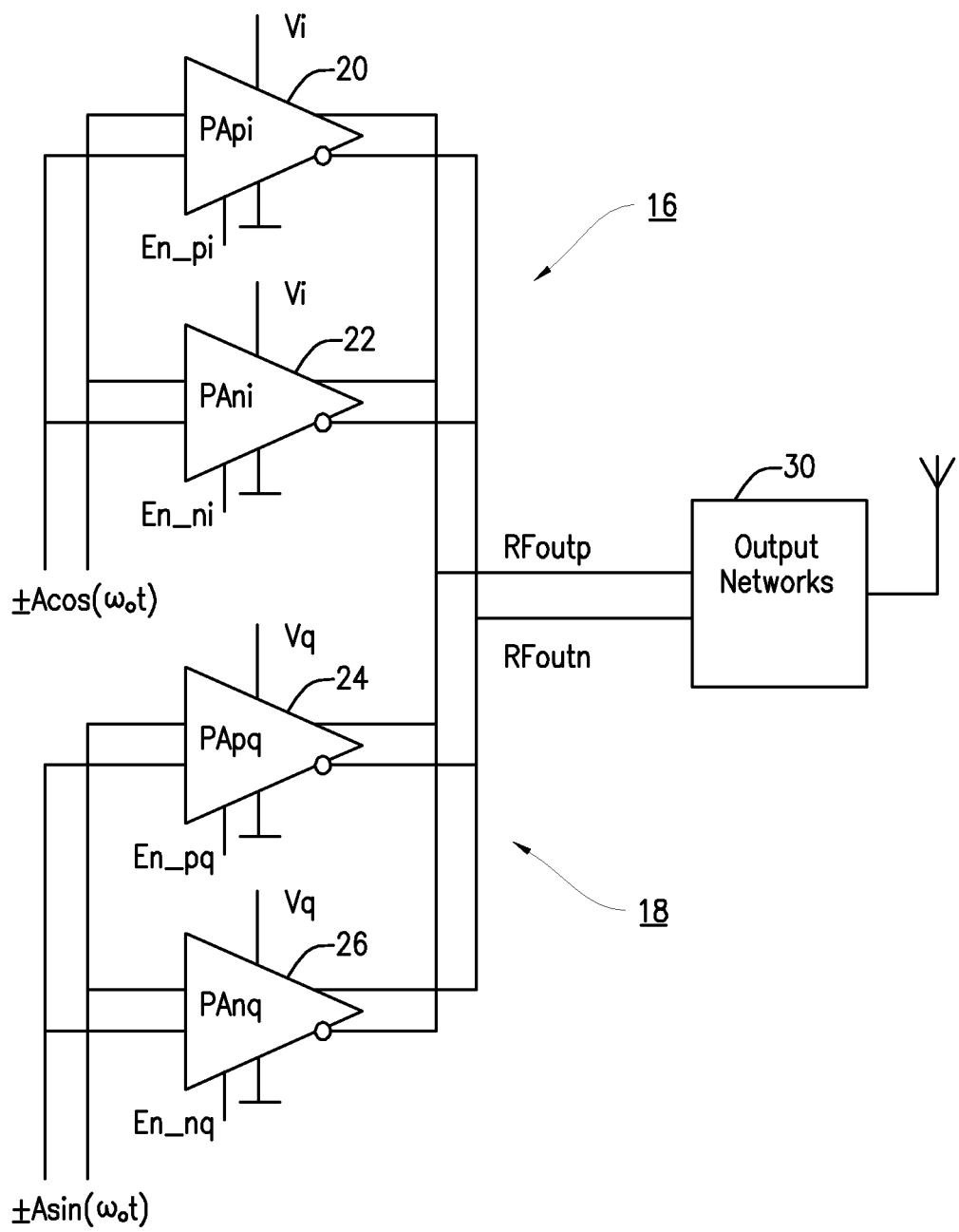
FIG. 3 is a block diagram of I and Q absolute quadrature modulated (AQM) power amplifiers.

FIG. 3 shows a more detailed view of the I and Q power amplifiers, 16 and 18, according to an example. Note that the amplifier sections 20 and 22 receive local oscillator signal +/−A cos(ωt) and modulate the local oscillator signal by the voltage Vi. Similarly, the amplifier sections 24 and 26 receive quadrature local oscillator signal +/−A sin(ωt), which is modulated by Vq. The polarity enable signals En_pi and En_pq, shown in graphs (e) and (f), respectively, are applied to sections 20 and 24. The polarity enable signals En_ni and En_nq are applied to sections 22 and 26 respectively. The signals En_ni and En_nq are the polarities of the I and Q signals, such as En_ni=(sign(I)/2+0.5)*Vh, and En_nq=(sign(Q)/2+0.5)*Vh, where Vh is a voltage corresponding to a high logic level.

The outputs of the four sections are merged to form the differential outputs RFoutp and RFoutn, which in turn are converted to a single output by an output matching network 30. In particular, a positive RF signal, RFoutp, is produced by combining the output of the I-channel positive amplifier part 20, the negative of the output of the I-channel negative amplifier part 22, the output of the Q-channel positive amplifier part 24 and a negative of the output of the Q-channel negative amplifier part 26. A negative RF signal, RFoutn, is produced by combining a negative of the output of the I-channel positive amplifier part 20, the output of the I-channel negative amplifier part 22, a negative of the output of the Q-channel positive amplifier part 24 and the output of the Q-channel negative amplifier part 26. The positive RF signal and the negative RF signal are combined to produce the RF output signal.

Thus, absolute quadrature modulation (AQM), as described above, uses polarity control signals to control the polarity of I and Q signals amplified by I and Q power amplifiers 16 and 18. In particular, the I-channel power amplifier 16 has a positive amplifier part 20 and a negative amplifier part 22. The positive amplifier part 20 receives a first positive enable signal to enable the output of the positive amplifier part 20 during a period of time corresponding to a positive polarity of the I-channel input signal. The negative amplifier part 22 receives a first negative enable signal to enable output of the negative amplifier part 22 during a period of time corresponding to a negative polarity of the I-channel input signal.

Similarly, the Q-channel power amplifier 18 has a positive amplifier part 24 and a negative amplifier part 26. The positive amplifier part 24 receives a first positive enable signal to enable the output of the positive amplifier part 24 during a period of time corresponding to a positive polarity of the Q-channel input signal. The negative amplifier part 26 receives a first negative enable signal to enable output of the negative amplifier part 26 during a period of time corresponding to a negative polarity of the Q-channel input signal.

Simulations of the circuit of FIGS. 1 and 3 reveal that the DC component of the absolute quadrature modulation (AQM) technique described above is about 4 decibels (dB) lower than the DC component of the amplitude modulation (AM) path of a polar modulation power amplifier. For frequencies higher than 100 Megahertz (MHz) the spectral power density of AQM is about 10 dB higher than the spectral power density of the AM path of a polar modulation power amplifier. Thus, in the AQM technique, the signals are expanded in bandwidth even more than the signals in the AM path of a polar modulation power amplifier, so the AQM technique requires a larger bandwidth of operation of its power amplifiers.

For example, one study shows that the bandwidth of the AM path of the polar modulation power amplifier must be at least about 3 times the bandwidth of the input signal, whereas the bandwidth of an I or Q path of the quadrature power amplifier using the AQM technique may be about 5 times the bandwidth of the input I or Q signal to achieve the same error vector magnitude (EVM) and adjacent channel leakage ratio (ACLR) as the AM path of the polar modulation power amplifier.

On the other hand, the increase in bandwidth is even greater for the phase modulation (PM) path of the polar modulation power amplifier, which may exceed ten times the baseband bandwidth of the input signal. Further, the delay mismatch between the AM paths and the PM path of the polar modulated power amplifier is very difficult to reduce to acceptable levels, whereas the delay mismatch between the I and Q-channels of the quadrature modulated power amplifier is inherently smaller because of the identical structures of the two channels.

Figure 4:
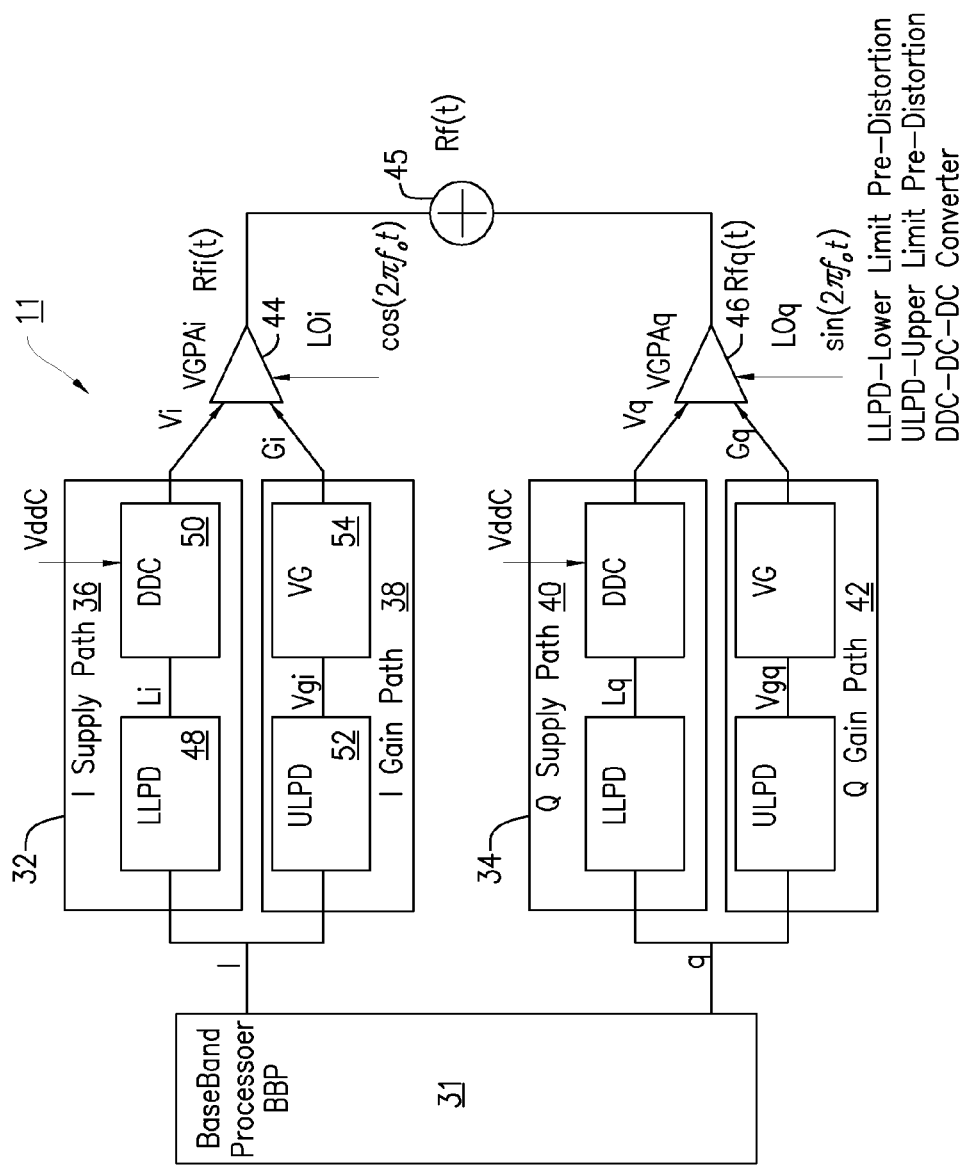
FIG. 4 is a block diagram of a quadrature modulated power amplifier subsystem having a supply channel and a gain channel for the I-channel and the Q-channel.

FIG. 4 is a block diagram of a quadrature modulated power amplifier subsystem 11 using the AQM technique described above with a combined gain amplification technique as described herein. The I-channel and the Q-channel each have a channel circuit 32 and 34, respectively, that receive I and Q-channel signals from a baseband processor 31. Each channel circuit has a supply path 36, 40 and a gain path 38, 42. The supply path 36, 40 has a constant supply voltage Vddc and baseband input I signal, Q signal, respectively. The gain path 38, 42 creates a gain control signal Gi, Gq, respectively.

In the corresponding variable gain power amplifier 44, 46, the output of the supply path 36, 40, Vi, Vq is the supply voltage and the output of the gain path 38, 42 is the gain control. The input of the variable gain amplifier 44, 46 is the local oscillator signal, which may be a sinusoid, cos(ωt), sin(ωt), or pulse signal having the same period. Using a pulse may result in better power efficiency and linearity, whereas using the sinusoid allows for the use of an LC clock driver, thereby reducing the power consumption of the clock driver. The output of the variable gain amplifier 44, 46 is an RF output having the modulated radio signal. The RF output signals of the variable gain amplifiers 44 and 46 are combined in a combiner 45 to produce the total RF output signal.

Thus, the power amplifier subsystem 11 includes an I-channel circuit 32 and a Q-channel circuit 34. Each channel circuit 32, 34 has a supply path, 36, 40 configured to process an input signal to produce a variable voltage based on the input signal. Each channel circuit 32, 34 has a gain path 38, 42 configured to process the input signal to produce a gain control signal. The outputs of the channel circuit 32, 34 are input to a variable gain amplifier 44, 46 configured to amplify a local oscillator such that during operation, the variable voltage is applied as a supply voltage to the variable gain amplifier 44, 46 and a gain of the gain amplifier 44, 46, is modulated by the gain control signal to modulate the local oscillator signal and to produce a modulated radio signal.

The supply path 36, 40 has a lower limit predistortion (LLPD) circuit 48 which provides a lower limited and pre-distorted output signal Li based on the I-channel input signal. The supply path 36, 40 also has a DC to DC converter 50 that converts energy from the constant supply voltage Vddc into a variable voltage Vi, Vq according to a function f(Li) that substantially negates the distortion produced by the pre-distortion circuit 48. In other words, the predistortion of the LLPD circuit 48 compensates for an inherent nonlinearity of the DC-to-DC converter 50. Thus the predistortion and f(Li) are approximately each other's inverses.

Figure 5:
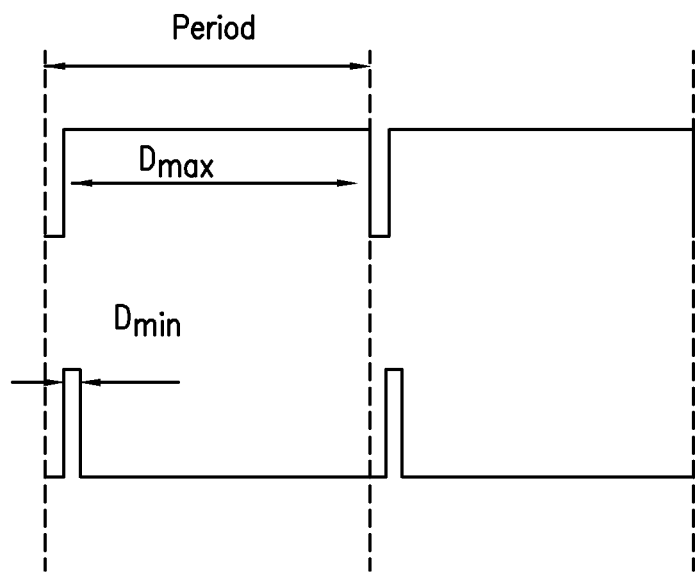
FIG. 5 shows a pulse width of a control signal of a DC to DC converter.
Figure 6:
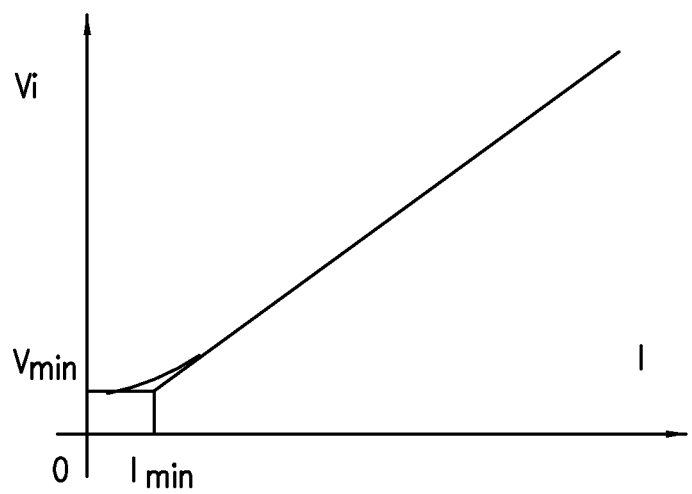
FIG. 6 is a graph of the voltage output for a given current input.

The pre-distortion circuit 48 is introduced to overcome the limitation of the DC to DC converter 50 that arises from the difficulty of outputting a very low voltage because a circuit cannot create a pulse having a pulse width less than a few times the propagation delay of the circuit. FIG. 5 shows a pulse width of a control signal of a DC to DC converter, and FIG. 6 is a graph of the voltage output for a given current input. A DC to DC converter 50 may have a voltage transfer function as shown in FIG. 6, where Imin is the input level of the I-channel corresponding to the minimum pulse width Dmin, shown in FIG. 5, which creates a minimum output voltage Vmin. In the DC to DC converter, without the predistortion supplied by the lower limit predistortion circuit 48, the output signal would disappear when the pulse width falls below Dmin. The variable voltage Vi, Vq produced by the supply path 36, 40 is a non-constant function of the input signal if the input signal exceeds the threshold Imin and is a constant if the input signal is below the threshold.

The gain path 38, 42 has an upper limit predistortion (ULPD) circuit 52 that provides an upper limited and predistorted output signal Vgi, Vgq, based on the input signal. The function block VG 54 models the non-linear part of the variable gain power amplifier 44, 46. Thus, the gain control signal Gi, Gq produced by the gain path 38, 42 is a constant if the input signal exceeds the threshold and is a non-constant function of the input signal if the input signal is below the threshold. By constructing the supply path and gain path signals as described, the variable gain amplifier 44, 46 can be modeled as an ideal multiplier.

Thus, the supply path 36, 40 has a lower limit pre-distortion circuit 48 and a DC to DC converter 50. The lower limit pre-distortion circuit 48 pre-distorts the first channel input signal to produce a pre-distorted output signal. The DC to DC converter 50 applies a first operation to the pre-distorted output signal to produce the variable voltage, where the first operation produces distortion that substantially negates the pre-distortion produced by the lower limit pre-distortion circuit 48. In other words, the predistortion of the LLPD circuit 48 compensates for an inherent nonlinearity of the DC-to-DC converter 50. Thus the predistortion and f(Li) are approximately each other's inverses.

The gain path 38, 42 has an upper limit pre-distortion (ULPD) circuit 52 and a variable gain circuit 54. The upper limit pre-distortion circuit 52 pre-distorts the input signal to produce a second pre-distorted output signal. The variable gain circuit 54 applies a second operation to the second pre-distorted output signal to produce the variable gain control signal, where the second operation produces distortion that substantially negates the pre-distortion produced by the upper limit pre-distortion circuit 52. In other words, the predistortion of the ULPD circuit 52 compensates for an inherent nonlinearity of the variable gain circuit 54. Thus the predistortion and said second operation are approximately each other's inverses.

Thus, according to the model of FIG. 4, the RF output from the I-channel may be represented as $Rfi(t) = f(V(I)) \cdot g(U(I)) \cdot \cos(2\pi f_o t + \omega i(I))$ where $f_c$ is the frequency of the carrier clock (local oscillator) and $\phi_i$ is the phase delay for the I-channel. Expecting a linear relationship between the amplitude of the input signal and the envelope of the RF output leads to:

$$f(V(I)) \cdot g(U(I)) = K_a I$$

$$\phi i(I) = c$$

where $K_a$ is the combined gain of the variable gain power amplifier 44, 46, and c is a constant. It proves to be more feasible to make $f(V(I)) \cdot g(U(I)) = K_a I$ than to make $f(V(I)) = K_a I$, because the latter is not possible for providing a continuous output for an input near zero. On the other hand, the former requires accurate calculation. Note that the condition, $\phi i(I) = c$, implies that phase compensation may be needed. Otherwise, the phase of the RF output signal will change with the input level, leading to EVM error and degradation in ACLR.

In one formulation, the supply path 36, 40 and the gain path 38, 42 may have a combined gain expressed as:

$$Ki(I) = f(V(I)) \cdot g(U(I)) = K_{si} \cdot K_{gi} = K_a I$$

where the functions f and g may be odd functions, which may result in a reduction of hardware. As shown in FIG. 6, the input signal can be divided into two regions, a linear region for $I \geq I_{min}$, and a non-linear region for $I < I_{min}$. The functions f and g can be represented as follows:

$$f(V(I)) = K_{si}$$
$$= \begin{cases} f(V(I_{min})), & |I| \leq I_{min} \\ f(V(I)), & |I| > I_{min} \end{cases}$$

and $$g(U(I)) = K_{gi}$$
$$= \begin{cases} \text{sign}(I) \cdot g_p(U(I)), & |I| \leq I_{min} \\ \text{sign}(I) \cdot g_p(U(I_{min})), & |I| > I_{min} \end{cases}$$

which leads to the following product:

$$f\left(V(I) \cdot g(U(I))\right) = \begin{cases} f(V(I_{min})) \cdot \text{sign}(I) \cdot g_p(U(I)), & |I| \leq I_{min} \\ f(V(I)) \cdot \text{sign}(I) \cdot g_p(U(I_{min})), & |I| > I_{min} \end{cases}$$
$$= \begin{cases} V_{min} \cdot \text{sign}(I) \cdot g_p(U(I)), & |I| \leq I_{min} \\ f(V(I)) \cdot \text{sign}(I) \cdot g_{max}, & |I| > I_{min} \end{cases}$$

where $V_{min} = f(V(I_{min}))$ is the minimum output voltage for the DC to DC converter, $g_{max} = |g(U(I_{min}))| = g_p(U(I_{min}))$ is the maximum gain for the variable gain amplifier 44, 46, and $g_p = |U^{-1}( )|$ is the absolute value of the inverse of the upper limit pre-distortion circuit 52.

To achieve these results, accurate calibration of the supply path 36, 40 and the gain path 38, 42, should be provided so that the combined gain $K_a$ is a constant for the modulated power amplifier 11. In other words, for both the linear and non-linear region, the following condition should be satisfied:

$$K_a = \frac{g_{max} \cdot f((V(I))}{I}$$
$$= \frac{V_{min} \cdot g((U(I))}{I}$$

In some embodiments, therefore, the first operation and the second operation are calculated to produce an output of the variable gain amplifier 44, 46 that is approximately equal to a constant gain multiplied by the input signal multiplied by the local oscillator signal. In some embodiments, the first operation and the second operation are calculated to produce an output of the variable gain amplifier 44, 46 that is a function of the pre-distorted output signal multiplied by a sign function multiplied by a function of the second pre-distorted output signal if the input signal is less than a threshold, and is a function of the first pre-distorted output signal multiplied by a sign function multiplied by a constant if the first channel input signal is greater than the threshold.

For the more general case, for a level of the input Ip>Imin:

$$f(V(I) \cdot g(U(I))) = \begin{cases} f(V(I)) \cdot \text{sign}(I) \cdot g_p(U(I)), & |I| \le I_p \\ f(V(I)) \cdot \text{sign}(I) \cdot g_p(U(I_p)), & |I| > I_p \end{cases}$$

$$= \begin{cases} f(V(I)) \cdot \text{sign}(I) \cdot g_p(U(I)), & |I| \le I_p \\ f(V(I)) \cdot \text{sign}(I) \cdot g_{max}, & |I| > I_p \end{cases}$$

where $g_p$ is a linear function of I and the following condition should be satisfied:

$$K_a = \frac{g((U(I)) \cdot f((V(I)))}{I}.$$

Assume that $F(I)=f((V(I))=\beta_0+\beta_1 I+\beta_2 I^2+\beta_3 I^3+\ldots$. Now $F(I)$ can be a non-linear function of I and the coefficients may be selected to make the transient edges smooth. For example:

$$F(0) = V_{min}$$

$$F(I_p) = \frac{K_a \cdot I_p}{g_{max}} \equiv F_p$$

$$F'(0) = 0$$

$$F'(I_p) = \frac{K_a}{g_{max}} \equiv dF_p$$

So that F(I) will output the minimum voltage and have a smooth first derivative at I=0. At I=$I_p$, F(I) will have continuity in its zeroth and first derivative.

Alternatively, assume that $FM=B'X\equiv[\beta_0,\beta_1,\beta_2,\beta_3]\cdot[1,x,x^2,x^3]'$. From the conditions above, a polynomial F(I) can be determined as AB=D, so that $$B = A^{-1}D$$

where $$A = \begin{bmatrix} 1 & 0 & 0 & 0 \\ 1 & I_p & I_p^2 & I_p^3 \\ 0 & 1 & 0 & 0 \\ 0 & 1 & 2I_p & 3I_p^2 \end{bmatrix}$$

and $$D = \begin{bmatrix} V_{min} \\ F_p \\ 0 \\ dF_p \end{bmatrix}$$

So the coefficients can be found as:

$$\beta_0 = V_{min}$$

$$\beta_1 = 0$$

$$\beta_2 = \frac{3F_p - 3V_{min} - dF_p \cdot i_p}{i_p^2}$$

$$\beta_3 = \frac{2V_{min} - 2F_p + dF_p \cdot i_p}{i_p^3}$$

The coefficients can be either calculated or calibrated through measurement and feedback control methods. The corresponding gain function should be $$G(I) \equiv g((U(I)) = \frac{K_a I}{F(I)}$$

to achieve linearity. This gain function can be implemented by a look up table. Thus, in some embodiments, a pre-distorted output signal is a non-linear function of the input signal modeled as a polynomial function having coefficients chosen to reduce transient components of the pre-distorted output signal.

Figure 7:
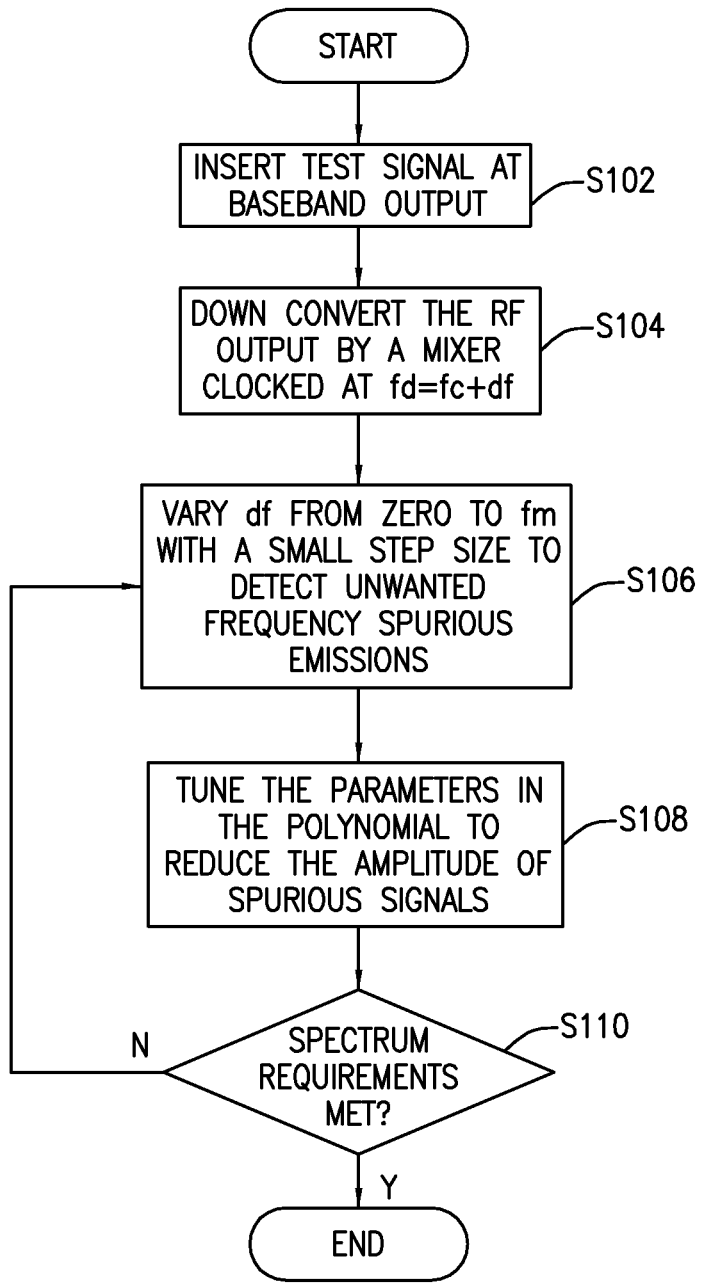
FIG. 7 is a flowchart of an exemplary calibration technique.

Note that calibration may be required to avoid a discontinuity at the transition at I=Imin. FIG. 7 is a flowchart of an exemplary calibration procedure. Calibration may be performed according to the following exemplary steps:

a. Insert test signal at base band output (block S102);

b. Down convert the RF output by a down-conversion mixer clocked at fd=fc+df, where fc is the carrier frequency and df is a variable frequency (block S104);

c. Vary df from 0 to a certain frequency fm of interested with a small step, fstep, to detect unwanted frequency spurious emission, such as for (df=0;df<fm; ddf+fstep) (block S106);

d. Tune the parameters in the polynomial to reduce the amplitude of the spurious signals (block S108);

e. Judge from the amplitude of the spurious signal if they meet the spectrum requirements (S110);

f. If not, return to c; otherwise go to g g. stop

Figure 8:
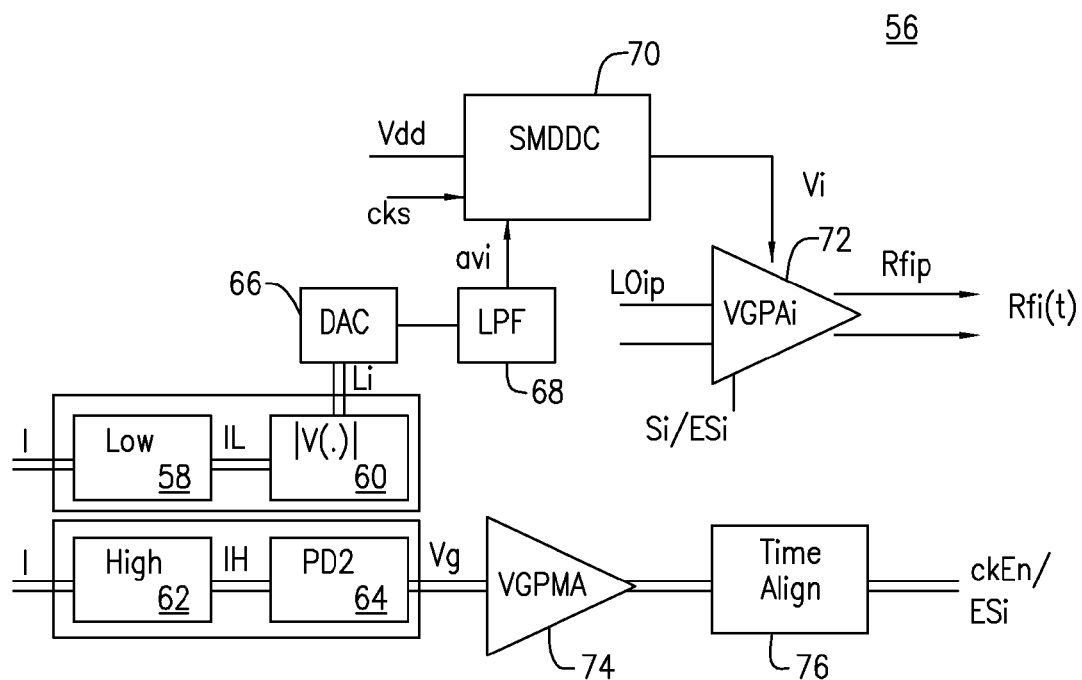
FIG. 8 is a block diagram of a switched mode implementation of a channel circuit and a variable gain amplifier.

FIG. 8 is a block diagram of a switched mode implementation of the channel circuit 32, 34 and variable gain amplifier 44, 46 shown in FIG. 4. The baseband signal I is lower limited by low limiter (LL) 58 and digitally pre-distorted by a first pre-distortion unit (PD1) 60. The baseband signal I is also upper limited by high limiter (HL) 62 and digitally pre-distorted by a second pre-distortion unit (PD2) 64.

The digital output of the first pre-distortion unit 60 is converted to an analog signal by a digital to analog converter 66 and is low pass filtered by a low pass filter 68 to produce a signal avi. The signal avi is input to a switched mode DC to DC converter (SMDDC) 70. The SMDDC 70 is switched at a clock signal cks and a variable output voltage Vi proportional to avi is generated by converting the constant supply voltage Vdd. The variable output voltage Vi is supplied to the variable gain power amplifier 72 as a supply voltage. The variable gain power amplifier 72 is switched by a differential carrier clock (LOip, LOin), to provide the amplitude modulated RF output RFi(t). Note that the polarity of the variable gain power amplifier 72 is controlled by the signal Si. Since changing the polarity of the variable gain Vg can lead to phase modulation, a phase compensation circuit can be optionally employed to cancel phase error.

The output of the second pre-distortion circuit 64 is input to a variable gain power modulation amplifier 74, followed by a time alignment circuit 76 used to align the delay from the supply path and the gain path. The output of the time alignment circuit 76 is either a clock driver vector, as discussed with reference to FIG. 9, or an enable control vector Esip and Esin, as discussed with reference to FIG. 10.

Figure 9:
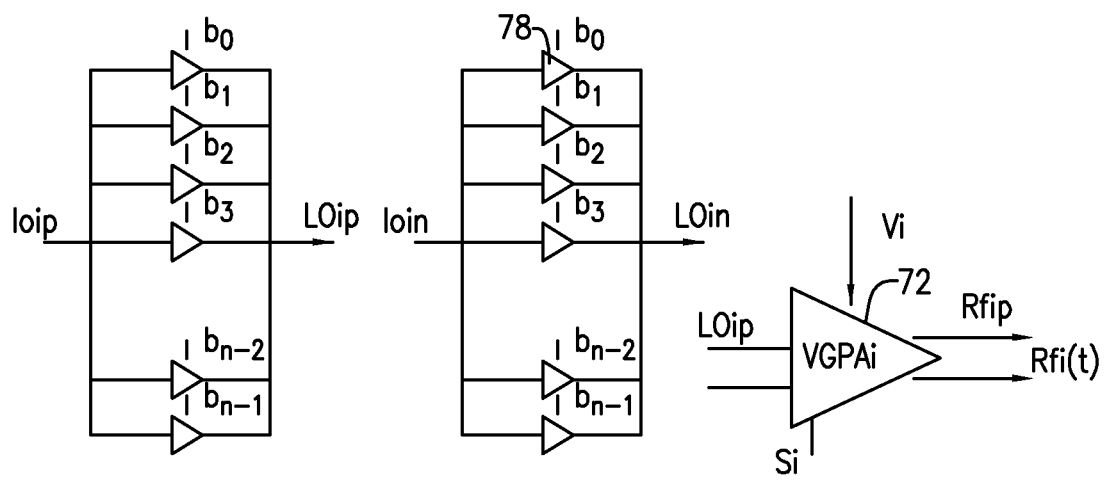
FIG. 9 are block diagrams of clock driver enablers and a variable gain power amplifier receiving the clock inputs.

In order to create an even lower power level of the RF output, the gain of the variable gain power amplifier 72 must be further controlled. One option for control of the gain of the variable gain power amplifier 72 is to reduce the amplitude of the carrier clock with a variable gain clock driver by changing the clock driver enable signals. These clock drivers 78 are enabled by enable signals that can be binary weighted bits b as shown in FIG. 9, or any arbitrary weight factors, w, which can be different widths of the clock drivers. The gain Vg can be expressed in a vector form either as $$Vg = \sum_{i=0}^{n-1} b_i 2^i$$

or more generally as $$Vg = \sum_{i=0}^{n-1} b_i w_i$$

Thus, the variable gain amplifier may be driven by a variable gain carrier clock with a gain adjusted by weighted enable signals. Thus, in some embodiments, the variable gain power amplifier 72 is driven be a variable gain carrier clock. The gain of the variable gain carrier clock may be adjusted by weighted enable signals applied to the drivers of the variable gain carrier clock, as shown in FIG. 9. Enabling and disabling clock drivers can cause a large quantization effect. To overcome this quantization effect, the few least significant bits (LSB) can be dithered at a high frequency so that the quantization effect can be averaged over time. Alternatively, the supply voltage of the clock driver can be reduced if speed is not an issue.

Figure 10:
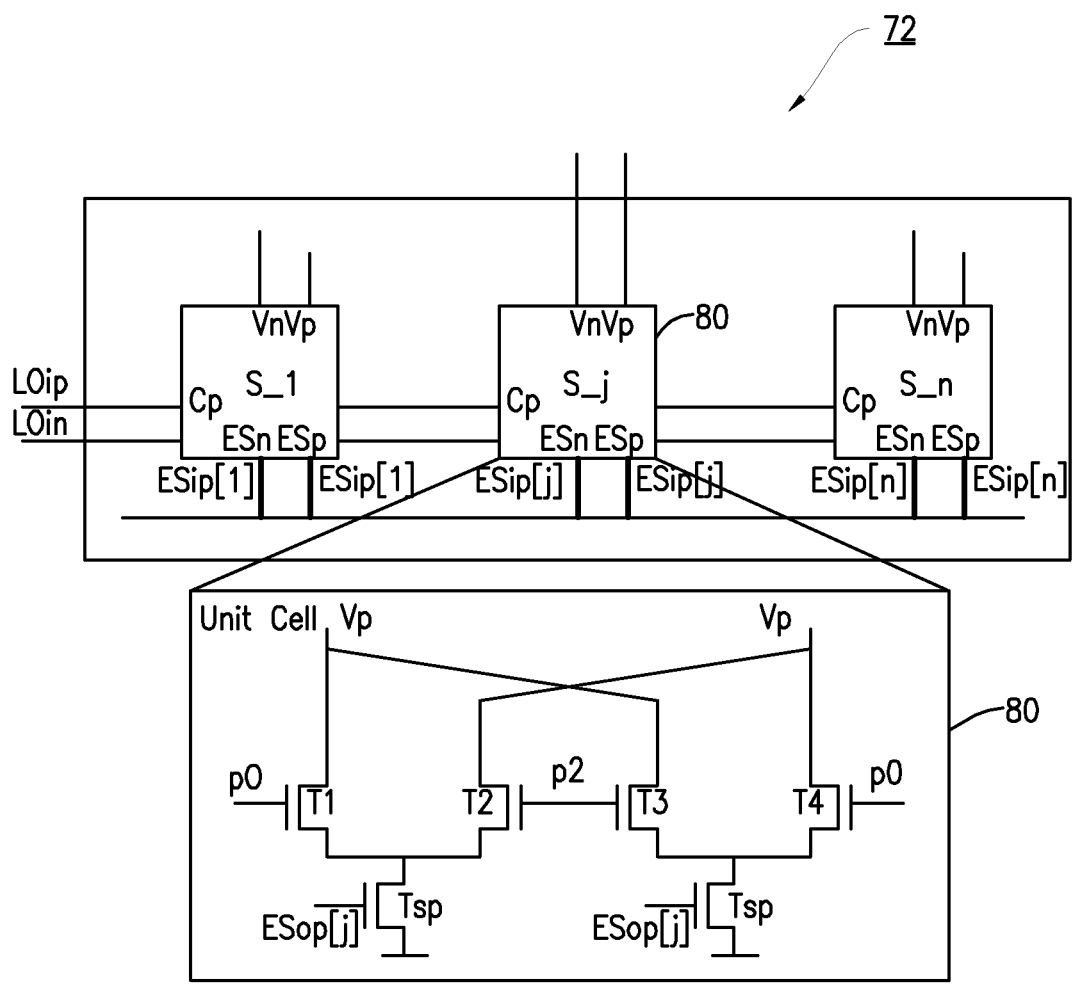
FIG. 10 is a block and circuit diagram of a variable gain power amplifier based on n unit cells.

Another option for controlling the gain of the variable gain power amplifier 72 is to reduce the number of enabled branches of the variable gain power amplifier 72. FIG. 10 is a block and circuit diagram of a variable gain power amplifier 72 based on n unit cells 80 controlled by a 2n dimensional digital vector control signal ESi=[ESip,ESin], where $ESip=Si \cdot B$ $ESin=\overline{Si} \cdot B$ and where Si and $\overline{Si}$ are the complementary bits for the sign function, with n elements, for instance Si=[s0, s1, ..., sn−1], where si is either logic 0 or logic 1, and logic 0 disables a branch and logic 1 enables a branch.

Amplitude distortion occurs in the non-linear region of the variable gain power amplifier 72 where the envelope of the RF output is not a linear function of the amplitude of the carrier clock. Thus, in some embodiments, a gain of the variable gain power amplifier 72 is adjusted by enabling or disabling selected numbers of parallel circuit paths of the variable gain power amplifier 72.

Figure 11:
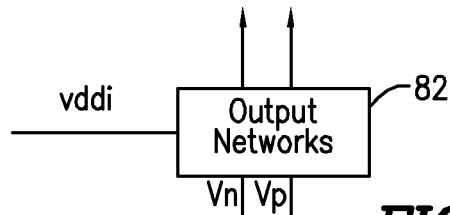
FIG. 11 is a block diagram of output networks that receive voltages from variable gain power amplifiers.
Figure 12:
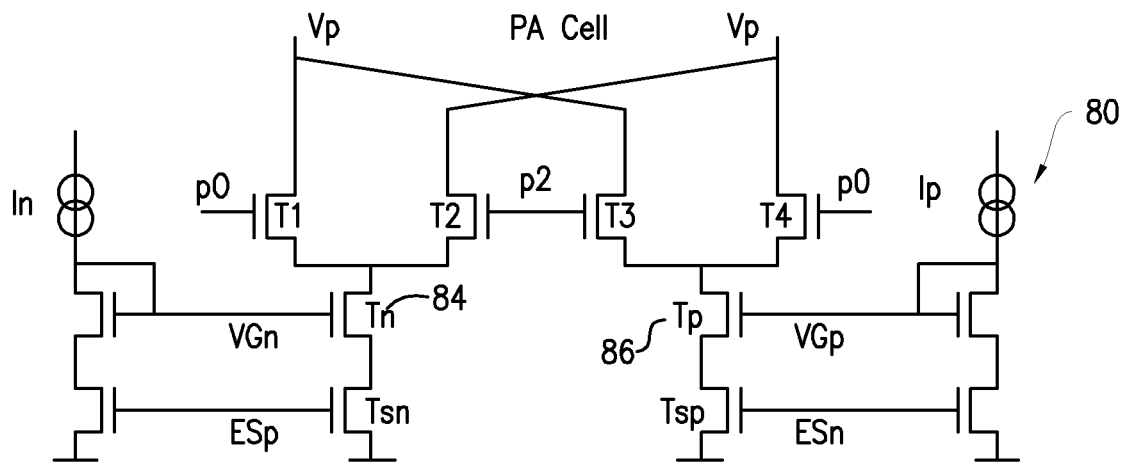
FIG. 12 is a circuit diagram of a power amplifier having a tail that is current controlled.
Figure 13:
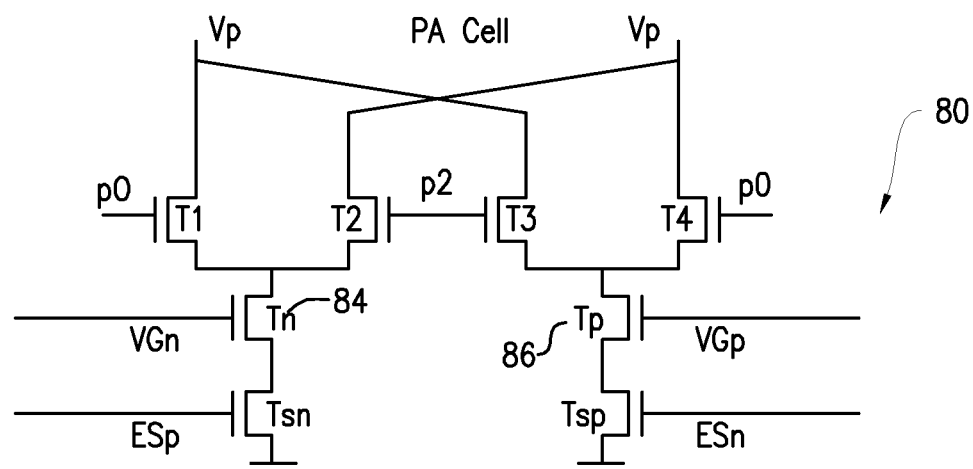
FIG. 13 is a circuit diagram of a power amplifier having a tail that is voltage controlled.

A third option for controlling the gain of the variable gain power amplifier 72 is shown in FIGS. 11, 12 and 13. FIGS. 12 and 13 show two unit cells 80 where the tail current is controlled by either a current mode, as shown in FIG. 12, or voltage mode, as shown in FIG. 13. The outputs Vn and Vp of the units cells 80 are connected to the output networks 82 of FIG. 11. The tail transistors Tn 84 and Tp 86 are controlled by the currents In and Ip, as shown in FIG. 12, or directly by the control voltage VGn and VGp, as shown in FIG. 13. Thus, in some embodiments, the gain of the variable gain power amplifier 72 is controlled by controlling a tail current of a least one unit cell of the variable gain amplifier via one of a current mode and a voltage mode.

Note that the first and second options may be performed digitally, whereas the third option is performed in the analog domain and may use a digital to analog converter and a low pass filter to implement.

When the desired RF output becomes very small in amplitude, a clock feed through effect in the variable gain power amplifier 72 can leak the carrier clock signal into the output due to the parasitic capacitances of the transistors of the power amplifier, as shown in FIG. 14. FIG. 14 shows a graph of output voltage Vn, Vp as a function of input signal for the partial unit cell shown at the bottom of FIG. 14, where it can be seen that clock feed through prevents the output from reaching zero when the input is zero. FIG. 15 shows a graph of the output voltage Vn, Vp as a function of input for the partial unit cell shown at the bottom of FIG. 15. Clock feed through can be overcome by using active leakage cancellation at the power amplifier output or by introducing neutralization capacitors 88, as shown in the circuit of FIG. 15. Thus, in some embodiments, the variable gain power amplifier includes neutralization capacitors to compensate for carrier clock signal leakage.

Figure 16:
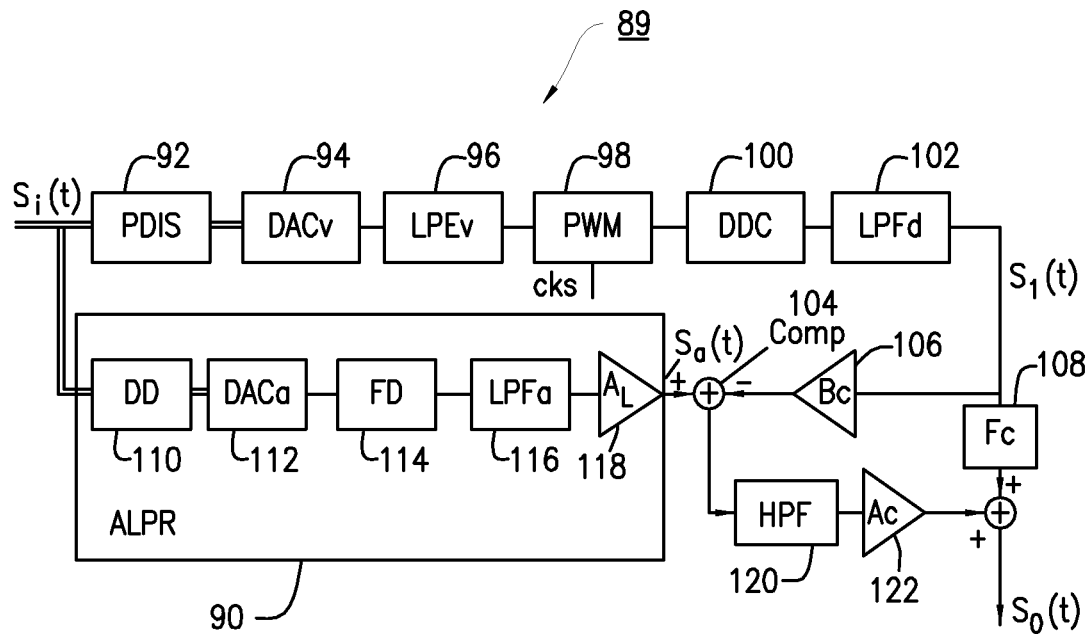
FIG. 16 is a more detailed block diagram of a supply path having an auxiliary linear power regulator (ALPR)

FIG. 16 is a more detailed block diagram of one embodiment of a supply path 89 corresponding to the supply path 36, 40. A purpose of the supply path embodiment shown in FIG. 16 is to introduce an auxiliary linear power regulator (ALPR) 90. A purpose of the ALPR 90 is to compensate group delay so that the supply path has a linear phase property. This enables matching of phase delay of the supply path 36, 40 and the gain path 38, 42. Further, the introduction of the ALPR 90 can relax the accuracy of pre-distortion and reduce the noise level in the receiver band as well.

The components of the supply path 89 include the pre-distortion circuit 92, the digital to analog converter 94, the low pass filter 96, pulse width modulator 98, the DC to DC converter 100, the low pass filter 102, the comparator 104, the backward coupler 106 and the forward coupler 108. The low pass filter 102 is associated with the DC to DC converter 100 and comprises the passive components, such as inductors and capacitors, that are used to generate an output voltage from a current pulse and to reduce the voltage ripple for the DC to DC converter 100. The pulse width modulator 98 may function as a sample and hold device because it operates at a switching clock speed and creates an output pulse width per pulse. The backward coupler 106 reduces the amplitude of the forward signal $S_1(t)$ so that the other circuit components can be designed for low voltage. The components of the supply path further include the high pass filter 120 and the active compensator 122.

Figure 17:
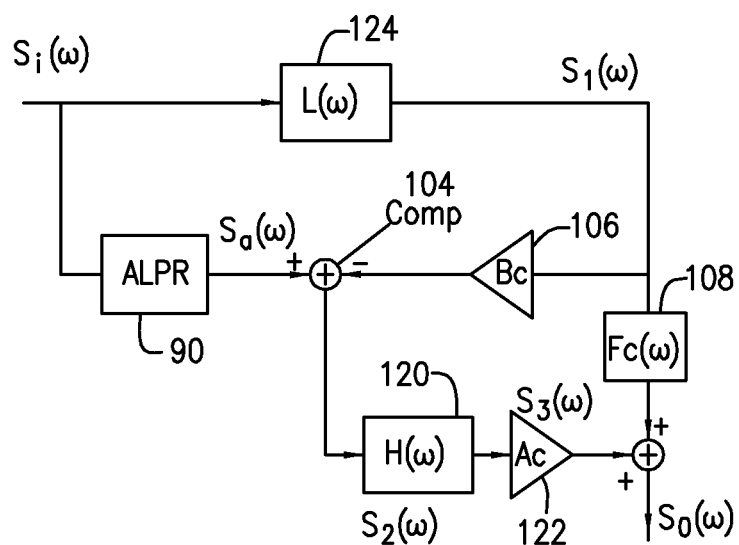
FIG. 17 is a frequency domain representation of the block diagram of FIG. 16.
Figure 18:
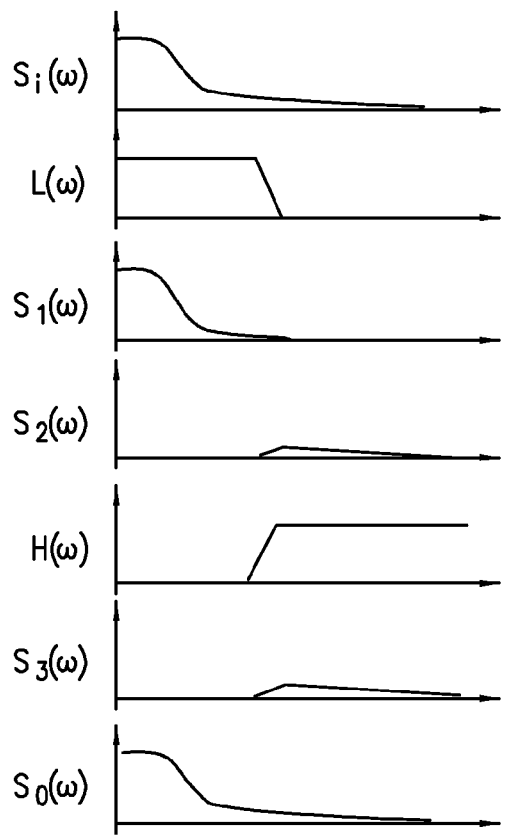
FIG. 18 is a series of graphs of frequency spectra of the block diagram of FIG. 11(b)

Components of the ALPR 90 include the digital delay 110, the digital to analog converter 112, the fine delay 114, the low pass filter 116 and the active linear buffer 118. All of the components of the ALPR 90 are operated in the linear region and provide a reference signal $S_a(t)$ for the supply path. Note that additional interpolation can be inserted before or after the digital delay 110 and the position of the fine delay 114 can be moved to another position in the ALPR 90. A simplified frequency domain model of the supply path is shown in FIG. 17, where the main forward supply path is represented by $L(\omega)$ 124. The spectra of the various signals are shown in FIG. 18.

In the frequency domain, the output $S_o(\omega)$ can be expressed as:

$$S_o(\omega) = S_1(\omega)Fc(\omega) + S_3(\omega)$$
$$= S_i(\omega)L(\omega)Fc(\omega) + k_iAcS_i(\omega)H(\omega) - BcAcS_i(\omega)L(\omega)H(\omega)$$
$$= S_i(\omega)[L(\omega)Fc(\omega) + k_iAcH(\omega) - BcAcL(\omega)H(\omega)]$$

where $k_i$ is the gain of the ALPR 90. To scale the coefficients so that $S_0(\omega)=S_i(\omega)$, let $$AP = [L(\omega)Fc(\omega) + k_iAcH(\omega) - BcAcL(\omega)H(\omega)] \Rightarrow 1$$

be an all pass filter. Letting $$k_i = Bc$$
$$= \frac{1}{Ac},$$

results in:

$$AP = [L(\omega)Fc(\omega) + H(\omega) - L(\omega)H(\omega)] \Rightarrow 1$$

As noted, $L(\omega)$ 124 is the frequency response of the main supply path which is dominated by the low pass filter 102 response.

$H(\omega)$ is the frequency response of the high pass filter HPF 120, and $F(\omega)$ is a low pass filter that has high impedance for the stop band. A main purpose of the HPF 120 is to reduce output conflict between the ALPR 90 and the main supply at the lower frequency range, so that the main supply provides most of the power in the low frequency range and so that the ALPR 90 provides a correction signal at a high frequency range. That is, the HPF 120 provides frequency isolation preventing the two paths from loading each other.

$Fc(\omega)$ 108 serves to create a small delay which matches the propagation time of the active compensator 122. Another function of $Fc(\omega)$ 108 is to provide a certain impedance at high frequency so the output signal created by ALPR 90 will not be shunt by the main supply output where the impedance is very low. Note that $Fc(\omega)$ 108 also behaves as a low pass filter, and normally the cut-off frequency is higher than that of $L(\omega)$ 124. $Fc(\omega)$ 108 can be implemented by a small inductor or a segment of transmission line.

Thus, in some embodiments, the supply path includes an auxiliary linear power regulator (ALPR) configured to compensate for group delay so that the first channel supply path exhibits an approximately linear phase as a function of frequency. Although the embodiment of FIG. 16 is a parallel structure, alternative embodiments may include a serial structure which, however, reduces power efficiency.

Figure 19:
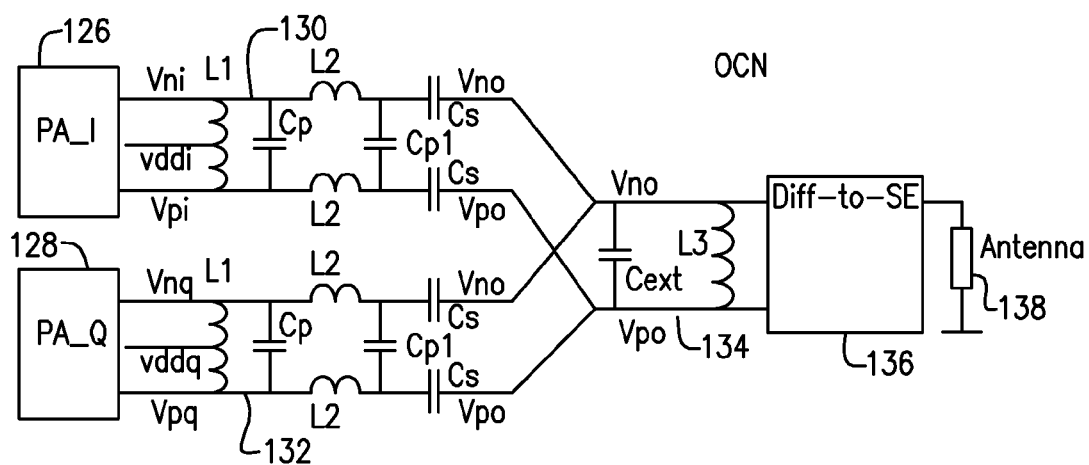
FIG. 19 is an output network coupling two power amplifiers to an antenna.

The output networks discussed above, such as the output networks 82 of FIG. 11, may be designed as shown in FIG. 19, which shows two AQM modulated digital power amplifiers 126 and 128 coupled to respective output coupling networks 130 and 132 which are in turn coupled to an output coupling network 134 which is output to a block 136 and coupled to the antenna 138. The differential to dingle-end converter 136 can be implemented with a balun or a piece of transmission line with far end ground. Such transmission line can be a cable or coplanar waveguide with a length that is a small fraction of a wavelength. The output coupling networks 130, 132 and 134 provide powers vddi and vddq to the power amplifiers 126 and 128, couple the quadrature power to the antenna 138, match the low output impedance of a few ohms of the power amplifiers 126 and 128 to the high impedance of 50 ohms of the antenna 138, and suppress high order harmonics, while passing the wideband radio signal to the antenna 138.

Figure 20:
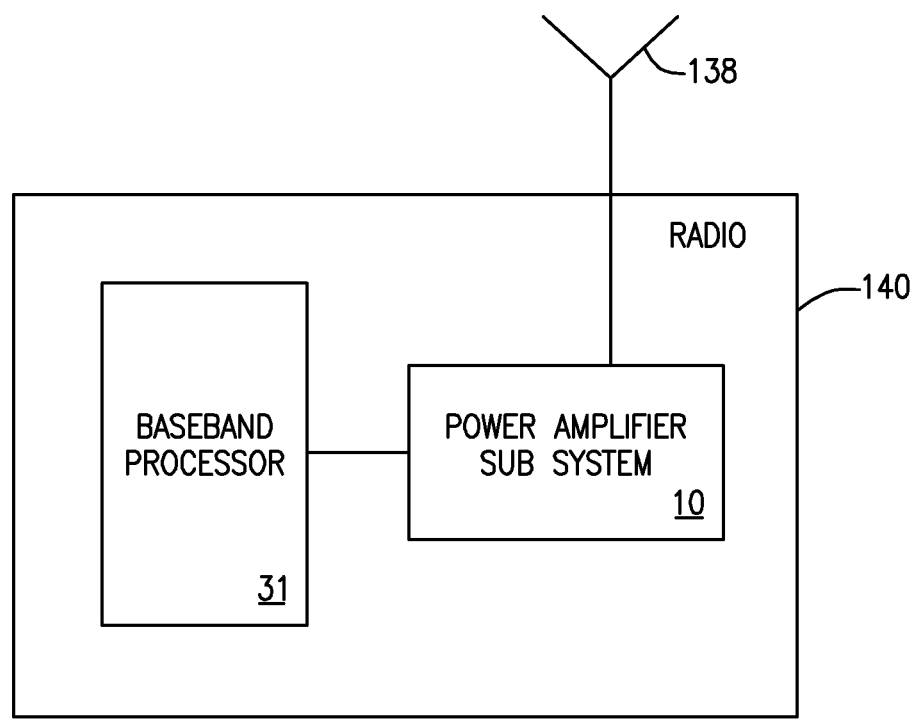
FIG. 20 is a block diagram of a power amplifier subsystem.

Devices that may include the embodiments described herein may include various radio communication apparatus, including base stations such as evolved node B (eNB) of an LTE wireless network, and mobile devices such as mobile phones and computers. As another example, the embodiments may be included in wireless access points and computing device and mobile devices of a WiFi network. Thus, as shown in FIG. 20, the power amplifier subsystem 10 may be included with a baseband processor 31 within a radio 140 that transmits via an antenna 138. For example, the methods described herein can be used in a radio transmitter where the analog power amplifier is replaced by two absolute quadrature modulated (AQM) digital power amplifiers, PA_I and PA_Q, as explained above.

Embodiments may be used in wideband applications such as LTE and WCDMA or narrow band applications such as GSM and EDGE. In embodiments described herein, non-linear pre-distortion may be performed digitally. Also, there is no need for a separate up-modulator in mobile devices, as compared to traditional implementations. Also, there is no external surface acoustic wave SAW filter as the IQ signals modulate the DC to DC converters directly. Further, there is no need to impedance match an RFIC and a power amplifier, since the two are merged together.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope of the invention, which is limited only by the following claims.

What is claimed is:

1. A power amplifier subsystem, comprising:
    a first channel circuit, comprising:
        a first channel supply path configured to process a first channel input signal to produce a first channel variable voltage based on the first channel input signal;
        a first channel gain path configured to process the first channel input signal to produce a first channel gain control signal; and
        a first channel variable gain amplifier configured to:
            receive the first channel variable voltage;
            receive the first channel gain control signal; and
            amplify a local oscillator signal such that, during operation, the first channel variable voltage is applied as a supply voltage to the first channel variable gain amplifier, a gain of the first channel variable gain amplifier being modulated by the first channel gain control signal to modulate the local oscillator signal and to produce a modulated radio signal;
    the first channel variable voltage produced by the first channel supply path being a non-constant function of the first channel input signal if the first channel input signal exceeds a threshold and being a constant if the first channel input signal is below the threshold; and
    the first channel gain control signal produced by the first channel gain path being a constant if the first channel input signal exceeds the threshold and being a non-constant function of the first channel input signal if the first channel input signal is below the threshold.

2. The power amplifier subsystem of claim 1, wherein the first channel supply path includes:
  a lower limit pre-distortion circuit configured to:
    receive the first channel input signal;
    pre-distort the first channel input signal to produce a first pre-distorted output signal; and
  a DC to DC converter configured to:
    receive the first pre-distorted output signal; and
    apply a first operation to the first pre-distorted output signal to produce the first channel variable voltage, the first operation producing distortion that substantially negates the pre-distortion produced by the lower limit pre-distortion circuit.

3. The power amplifier subsystem of claim 1, wherein the first channel gain path includes:
  an upper limit pre-distortion circuit configured to:
    receive the first channel input signal; and
    pre-distort the first channel input signal to produce a second pre-distorted output signal; and
  a variable gain circuit configured to:
    receive the second pre-distorted output signal;
    apply a second operation to the second pre-distorted output to produce the variable gain control signal, the second operation producing distortion that substantially negates the pre-distortion produced by the upper limit pre-distortion circuit.

4. A power amplifier subsystem, comprising:
  a first channel circuit, comprising:
    a first channel supply path configured to process a first channel input signal to produce a first channel variable voltage based on the first channel input signal;
    a first channel gain path configured to process the first channel input signal to produce a first channel gain control signal; and
    a first channel variable gain amplifier configured to:
      receive the first channel variable voltage;
      receive the first channel gain control signal; and
      amplify a local oscillator signal such that, during operation, the first channel variable voltage is applied as a supply voltage to the first channel variable gain amplifier, a gain of the first channel variable gain amplifier being modulated by the first channel gain control signal to modulate the local oscillator signal and to produce a modulated radio signal; and
  a second channel circuit electrically in parallel with the first channel circuit, the second channel circuit comprising:
    a second channel supply path configured to process a second channel input signal to produce a second channel variable voltage based on the second channel input signal;
    a second channel gain path configured to process the second channel input signal to produce a second channel gain control signal; and
    a second channel variable gain amplifier configured to:
      receive the second channel variable voltage;
      receive the second channel gain control signal; and
      amplify the local oscillator signal such that, during operation, the second channel variable voltage is applied as a supply voltage of the second channel variable gain amplifier, a gain of the second channel variable gain amplifier being modulated by the second channel gain control signal to modulate the local oscillator and to produce a modulated radio signal.

5. The power amplifier subsystem of claim 1, wherein the first operation and the second operation are calculated to produce an output of the first channel variable gain amplifier that is approximately equal to a constant gain multiplied by the first channel input signal multiplied by the local oscillator signal.

6. The power amplifier subsystem of claim 1, wherein the first operation and the second operation are calculated to produce an output of the first channel variable gain amplifier that is approximately:
  a function of the first pre-distorted output signal multiplied by a sign function multiplied by a function of the second pre-distorted output signal if the first channel input signal is less than a threshold; and
  a function of the first pre-distorted output signal multiplied by a sign function multiplied by a constant if the first channel input signal is greater than the threshold.

7. The power amplifier of claim 1, wherein the first operation applied to the first pre-distorted output signal is a non-linear function of the first channel input signal modeled as a polynomial function with coefficients chosen to reduce transient components of the first pre-distorted output signal.

8. The power amplifier subsystem of claim 1, where the first channel supply path further comprises an auxiliary linear power regulator configured to compensate for group delay so that the first channel supply path exhibits an approximately linear phase as a function of frequency.

9. The power amplifier subsystem of claim 1, wherein the first channel variable gain amplifier is driven by a variable gain carrier clock, a gain of the variable gain carrier clock being adjusted by weighted enable signals.

10. The power amplifier subsystem of claim 1, wherein the first channel variable gain amplifier has parallel circuit paths and a gain of the first channel variable gain amplifier is adjusted by enabling a selected number of parallel circuit paths of the first channel variable gain amplifier.

11. The power amplifier subsystem of claim 1, wherein a gain of the first channel variable gain amplifier is controlled by controlling a tail current of at least one unit cell of the first channel variable gain amplifier via one of a current mode and a voltage mode.

12. The power amplifier subsystem of claim 1, wherein the first channel variable gain amplifier further includes neutralization capacitors to compensate for carrier clock signal leakage.

13. An quadrature power amplifier subsystem, comprising:
  an I-channel DC to DC converter to convert an I-channel input signal to an I-channel output signal, the I-channel DC to DC converter being modulated by a first modulation signal to cause a reversal of a polarity of the I-channel input signal at one of negative and positive alternations, so that the I-channel output signal is of a single polarity; and
  a Q-channel DC to DC converter to convert a Q-channel input signal to a Q-channel output signal, the Q-channel DC to DC converter being modulated by a second modulation signal to cause a reversal of a polarity of the Q-channel input signal at the one of negative and positive alternations, so that the Q-channel output signal is of the single polarity.

14. The quadrature power amplifier subsystem of claim 13, further comprising:
  an I-channel power amplifier receiving the I-channel output signal, the I-channel power amplifier having an I-channel positive amplifier part and an I-channel negative amplifier part, the I-channel positive amplifier part receiving a first positive enable signal to enable output of the I-channel positive amplifier part during a period of time corresponding to a positive polarity of the I-channel input signal, the I-channel negative amplifier part receiving a first negative enable signal to enable output of the I-channel negative amplifier part during a period of time corresponding to a negative polarity of the I-channel input signal; and a Q-channel power amplifier receiving the Q-channel output signal, the Q-channel power amplifier having a Q-channel positive amplifier part and a Q-channel negative amplifier part, the Q-channel positive amplifier part receiving a second positive enable signal to enable output of the Q-channel positive amplifier part during a period of time corresponding to a positive polarity of the Q-channel input signal, the Q-channel negative amplifier part receiving a second negative enable signal to enable output of the Q-channel negative amplifier part during a period of time corresponding to a negative polarity of the Q-channel input signal.

15. The quadrature power amplifier subsystem of claim 14, wherein:
the I-channel power amplifier modulates a local oscillator signal via the I-channel output signal to produce an I-channel RF signal; and
the Q-channel power amplifier modulates a local oscillator signal via the Q-channel output signal to produce a Q-channel RF signal.

16. The quadrature power amplifier subsystem of claim 14, further comprising:
a first signal combiner configured to produce a positive RF signal by combining:
an output of the I-channel positive amplifier part;
a negative of an output of the I-channel negative amplifier part;
an output of the Q-channel positive amplifier part; and
a negative of an output of the Q-channel negative amplifier part; and
a second signal combiner configured to produce a negative RF signal by combining:
a negative of the output of the I-channel positive amplifier part;
the output of the I-channel negative amplifier part;
a negative of the output of the Q-channel positive amplifier part; and
the output of the Q-channel negative amplifier part.

17. The quadrature power amplifier subsystem of claim 16, comprising a third signal combiner configured to combine the positive RF signal and the negative RF signal to produce an RF output signal.

18. The quadrature power amplifier subsystem of claim 13, further comprising a first pre-distortion circuit configured to pre-distort the I-channel input signal prior to input of the I-channel input signal to the I-channel DC to DC converter.

19. The quadrature power amplifier subsystem of claim 13, wherein the I-channel output is a non-constant function of the I-channel input signal if the I-channel input signal exceeds a threshold and is a constant if the I-channel input signal is below the threshold.

20. The quadrature power amplifier subsystem of claim 19, wherein the Q-channel output is a non-constant function of the Q-channel input signal if the Q-channel input signal exceeds a threshold and is a constant if the Q-channel input signal is below the threshold.

21. The quadrature power amplifier subsystem of claim 19, further comprising an I-channel gain path producing an I-channel gain control signal, the I-channel gain control signal being a constant if the I-channel input signal exceeds the threshold and being a non-constant function of the I-channel input signal if the I-channel input signal is below the threshold.

22. The quadrature power amplifier subsystem of claim 21, further comprising a Q-channel gain path producing a Q-channel gain control signal, the Q-channel gain control signal being a constant if the Q-channel input signal exceeds the threshold and being a non-constant function of the Q-channel input signal if the Q-channel input signal is below the threshold.

* * * * *

UNITED STATES PATENT AND TRADEMARK OFFICE
CERTIFICATE OF CORRECTION

PATENT NO. : 9,106,501 B2  
APPLICATION NO. : 13/856206  
DATED : August 11, 2015  
INVENTOR(S) : Mu et al.

Page 1 of 1

It is certified that error appears in the above-identified patent and that said Letters Patent is hereby corrected as shown below:

In the Specification

In Column 9, Lines 53-54, delete "$Rfi(t)=f(V(I)).g(U(I)).cos(2\pi f_0 t+\omega i(I))$" and insert -- $Rfi(t)=f(V(I)).g(U(I)).cos(2\pi f_0 t+\varphi i(I))$ --, therefor.

In Column 12, Line 31, delete "(df=0;df<fm ddf+fstep)" and insert -- (df=0;df<fm;df=df+fstep) --, therefor.

Signed and Sealed this
Sixteenth Day of February, 2016

Michelle K. Lee
*Director of the United States Patent and Trademark Office*